United States Patent [19]
Maier et al.

[11] Patent Number: 5,808,327
[45] Date of Patent: Sep. 15, 1998

[54] AC CONTROLLER

[75] Inventors: Reinhard Maier, Herzogenaurach; Heinz Mitlehner, Uttenreuth; Hermann Zierhut, Neutraubling, all of Germany

[73] Assignee: Siemens Aktiengesellschaft, München, Germany

[21] Appl. No.: 605,227

[22] PCT Filed: Sep. 8, 1993

[86] PCT No.: PCT/DE93/00825

§ 371 Date: Mar. 8, 1996

§ 102(e) Date: Mar. 8, 1996

[87] PCT Pub. No.: WO95/07571

PCT Pub. Date: Mar. 16, 1995

[51] Int. Cl.⁶ .................................... H01L 29/74
[52] U.S. Cl. .................. 257/161; 257/213; 257/691; 257/901
[58] Field of Search ...................... 257/161, 691, 257/901, 213; 388/811, 903; 315/308, 310, 106, 307, 223

[56] References Cited

U.S. PATENT DOCUMENTS 5,225,741  7/1993  Auld, Jr. et al. .................. 315/307

FOREIGN PATENT DOCUMENTS 2065404  6/1981  United Kingdom.
WO 93/11608  6/1993  WIPO.

*Primary Examiner*—Carl W. Whitehead, Jr.
*Attorney, Agent, or Firm*—Kenyon & Kenyon

[57] ABSTRACT

An AC power controller includes at least two semiconductor regions reverse-connected in series. Each semiconductor region has an electron donor (source), an electron sink (drain) and an electron flow control electrode (gate) with characteristic curves such as those exhibited by FETs. Each semiconductor region also has an internal body diode. The gate-source voltage of a respective semiconductor region in the forward direction is set to be large enough to establish a desired limiting of the drain-source current. Yet, the gate-source voltage of the semiconductor region in the inverse mode is set to be large enough for the body diode to remain de-energized.

4 Claims, 2 Drawing Sheets

AC CONTROLLER

FIELD OF THE INVENTION

The present invention relates to an AC power controller which operates with at least two reverse-connected series semiconductor regions. The semiconductor regions, which are each provided with an electron donor (source), an electron sink (drain) and an electrode (gate) which controls the flow of electrons, have the same characteristic curves as FETs. According to contemporary knowledge, they also have an internal body diode, dictated by the technology, which operates in the inverse mode.

BACKGROUND INFORMATION

A known power circuit-breaker (WO 93/11608) operates with two FETs reverse-connected in series. In such a power circuit-breaker, the release element of the component acting as a relay is arranged electrically in parallel with a semiconductor element having two FETs reverse-connected in series. The component can interrupt a line train to be protected by means of interrupter contacts. In such a case, the semiconductor element is set such that its internal impedance has a low value when there is a specific control voltage across a control electrode and an operating voltage across working electrodes that are situated in the direction of continuity in the line train. The internal impedance of the semiconductor element rises abruptly as the voltage across the working electrodes rises. In the event of an increase in the internal impedance, voltage is applied to the release element arranged in parallel, which voltage results in tripping of the circuit-breaker.

Electrical installations have to be connected to and isolated from an electricity supply. In the case of mechanical switches, there are optimized solutions which in practice satisfy certain technical requirements. For example, in the case of drives, motor protective circuit-breakers provide overload protection and short-circuit protection. It is generally desirable in the case of protective switchgear, which includes power circuit-breakers, motor protection circuit-breakers and line protection circuit-breakers, to rapidly detect overload currents that occur, in particular short-circuit currents, and to limit them to small values and finally to disconnect them.

Mechanical protective switchgear has the disadvantages of contact wear, frequent maintenance and a comparatively slow switching time in the event of a short circuit, as well as comparatively low temporal accuracy of the switching instance.

In contrast, semiconductor switches can operate without any wear and switch rapidly; they have low switching losses and they can be controlled in a variable manner. On the other hand, the disadvantages of semiconductor switches are: high costs, large space requirements and comparatively high forward losses.

In general terms, it is frequently desirable to limit alternating currents rapidly to specific values, so that overcurrents become tolerable or to allow time for disconnection. Semiconductor elements can also be operated in such a way that they reduce current all the way down to the point of disconnection.

SUMMARY OF THE INVENTION

The present invention is based on the object of developing an advantageous AC power controller using semiconductor technology. The invention is, at the same time, based on the knowledge that the previously discussed devices and elements can be designed as AC power controllers in the broadest sense.

According to an embodiment of the invention, the above-mentioned object is achieved by an AC power controller semiconductor regions with reverse-connected in series. The gate-source voltage for a respective semiconductor region in the forward direction is set to be large enough for a desired limiting of the drain-source current to be established. For the semiconductor region in the inverse mode, the respective gate-source voltage is only set to be large enough for the body diode to remain de-energized. In other words, the second semiconductor region has at this current a voltage drop such that its body diode is still de-energized.

The invention is based on the knowledge here that the forward losses in relevant semiconductor elements are composed of the losses in the switching element and of the losses of additional freewheeling diodes which are frequently connected in series. Special freewheeling diodes are not necessary in the AC power controller, since bipolar conductivity mechanisms and stored charges connected therewith are not present. Therefore, separate freewheeling diodes are not required, nor does the body diode, which is a condition of the semiconductor technology, come into effect. The AC power controller therefore operates with particularly low steady-state and dynamic losses. Steady-state losses include the losses during current continuity and dynamic losses include switching-over losses.

If the semiconductor regions are formed from silicon carbide, SiC, this yields particularly large and favorable operating ranges in the family of characteristic curves. The semiconductor regions can be formed in a microchip or alternatively be designed as discrete FETs.

BRIEF DESCRIPTION OF THE DRAWINGS

The present invention will hereinafter be explained in more detail with respect to exemplary embodiments which are represented in diagrammatic form in the drawings wherein.

DETAILED DESCRIPTION

Figure 1:
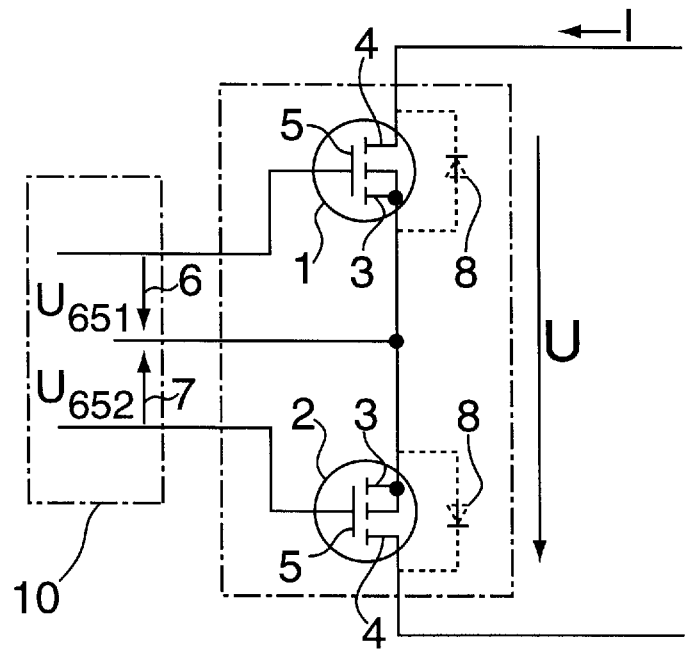
FIG. 1 illustrates an AC power controller according to an embodiment of the present invention.

FIG. 1 illustrates an AC power controller including two semiconductor regions 1 and 2 reverse-connected in series, which are represented as discrete FETs in the exemplary embodiment. Each semiconductor region 1, 2 has a source 3, a drain 4 and a gate 5.

In the forward direction, for example, for the semiconductor region 1, the gate-source voltage 6 ($U_{GS1}$) is set to be large enough to establish a desired limiting of the drain-source current. The gate-source voltage is, in this case, a parameter for current limiting lines such as those illustrated in FIG. 3. For the semiconductor region in the inverse mode, the gate-source voltage is only set to be large enough for the body diode 8 to be de-energized. For example, with reference to FIG. 1, in the inverse mode the gate-source voltage 7 ($U_{GS2}$) for semiconductor region 2 would only be set large enough to de-energize body electrode 8.

In the case of an FET made of silicon carbide, the threshold voltage is approximately 2.8 V. In the case of silicon, threshold voltages of approximately 0.7 V are customary. Thus, the gate-source voltage at the semiconductor region 2 is then to be set in such a way that the voltage drop across the operating path is lower than the threshold voltage of the body diode.

The semiconductor regions 1 and 2 can be formed from silicon carbide and be implemented, in particular, in a microchip. The semiconductor regions can also be designed as discrete FETs, in particular as MOSFETs.

In the case of the AC power controller according to FIG. 1, gate driving suffices for both semiconductor regions 1, 2 in both current directions, although at potentials of different magnitude. For an applied voltage U, the AC power controller sets a current I to a desired value in the family of operating characteristic curves, as a function of the gate-source voltage 6, 7.

Figure 2:
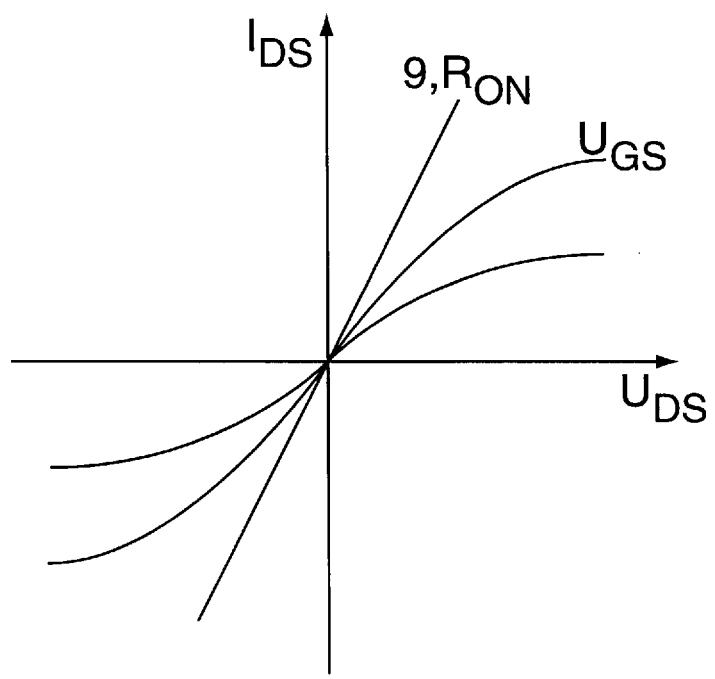
FIG. 2 illustrates, for a semiconductor region, the drain-source current ($I_{DS}$) versus the drain-source voltage ($U_{DS}$) for the gate-source voltage ($U_{GS}$) in the vicinity of the origin for two semiconductor regions reverse-connected in series.

In the case of a semiconductor region having characteristic curves such as those exhibited by FETs, characteristic curves according to FIG. 2 are produced at small drain-source voltages for reverse-connected series semiconductor regions. With an increasing gate-source voltage ($U_{GS}$) as the parameter, the characteristic curves starting at the origin tend to follow the straight line 9 ($R_{ON}$) to a greater and greater extent. Viewed another way, a steep characteristic curve for the ON resistance (i.e., a very low ON resistance) is achieved at high gate-source voltages. This characteristic curve, which is to be interpreted as the resistance, exhibits a linear, (e.g. ohmic), behavior. With reverse-connected series circuitry, the characteristic curves and $R_{ON}$ extend in the first and third quadrants. In the case of silicon carbide, for example, the voltage drop in the forward direction caused by $R_{ON}$ is distinctly lower than the threshold voltage of the body diode.

Figure 3:
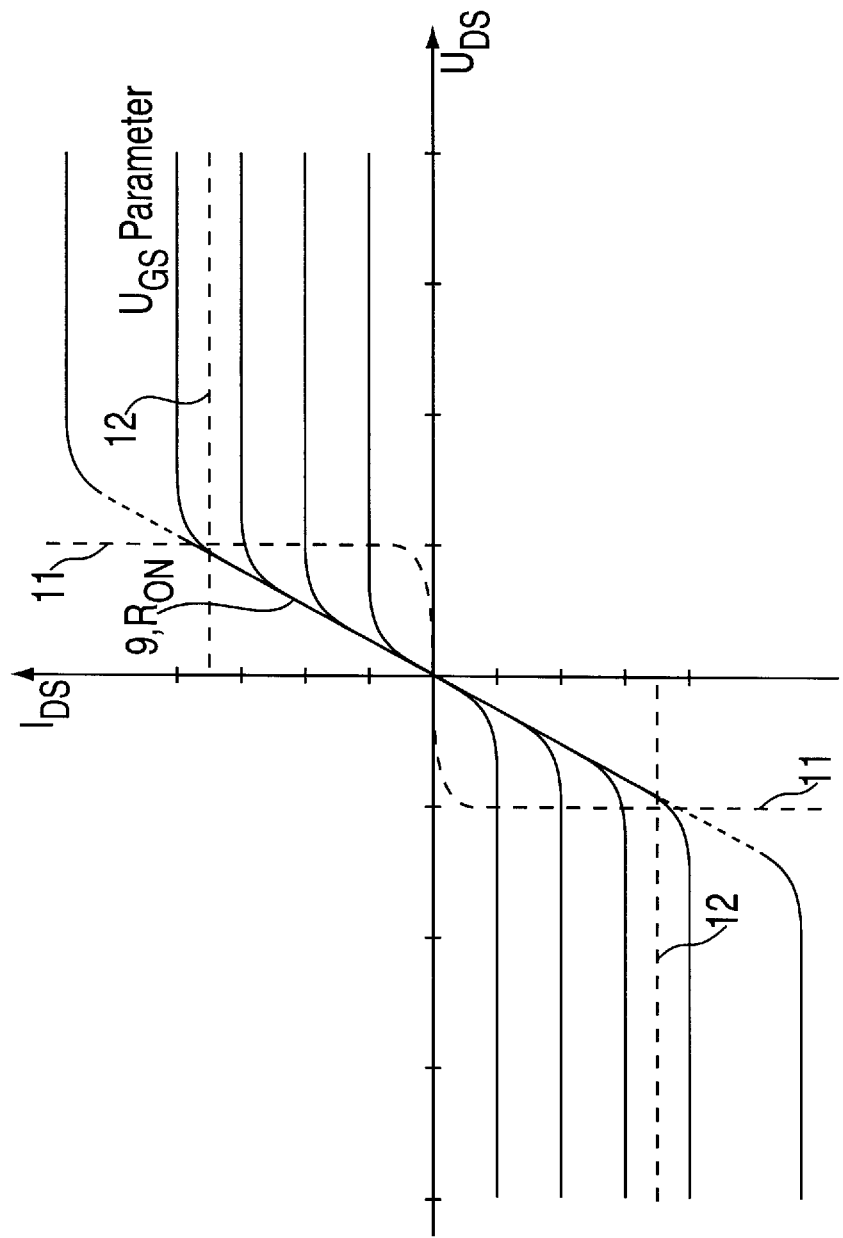
FIG. 3 illustrates, on a different scale than FIG. 2 including higher drain-source voltages, a family of characteristic curves for $I_{DS}$ versus $U_{DS}$ for semiconductor regions reverse-connected in series.

FIG. 3 illustrates, on a different scale, a family of characteristic curves similar to FIG. 2, but including higher drain-source voltages and parameters with a higher gate-source voltage. Characteristic curves which limit the drain-source current are produced approximately parallel to the abscissa for gate-source voltages. For the sake of simplicity, it will be assumed that enhancement-mode FETs are used for the semiconductor regions, these being normally off and having an n-channel.

The illustration in FIG. 1 corresponds to the above subject matter. The body diodes 8 produce a superposition with a characteristic curve 11 in the first and third quadrants. Operation along the characteristic curve 11, which illustrates that the body diode in parallel with the operating path of the semiconductor region becomes effective in the reverse direction, can be avoided by setting the gate-source voltage for the semiconductor region in the inverse mode only to be large enough for the body diode to remain de-energized. That is, operating in the region between the abscissa and the limiting line 12 through the point of intersection between the $R_{ON}$ resistance 9 and the characteristic curve 11 for the body diode. This avoids bipolar conductivity mechanisms in any operating mode, so that stored charges do not occur; as a result, the steady-state and dynamic losses of the AC power controller are kept low.

A desired drain-source current can be set in the event of over-voltages by means of a suitable gate-source voltage as a parameter in the family of characteristic curves according to FIG. 3. During normal operation of the AC power controller, only low losses occur, corresponding to the characteristic curve 9 for the $R_{ON}$ resistance. As shown, the more steeply the characteristic curve 9 proceeds, the lower the losses are. In the case of silicon carbide and particularly in the case of a structure in the manner of a MOSFET, it is possible to effect current limiting, for example, approximately between 300 and 5000 V for the voltage U according to FIG. 1. The respective gate-source voltage can be generated by a drive circuit 10 according to FIG. 1 in a manner known per se.

If the gate-source voltage for the respective semiconductor region, in the inverse region, is set only to be large enough for the body diode of the relevant semiconductor region to remain de-energized, separate freewheeling diodes are not required to lower the dynamic losses, since essentially they do not occur at all.

The AC power controller described herein can be used in a very wide variety of applications. For example, it can be used as a special limiter in series with commercially available protective circuit-breakers, the current being limited in the limiter to a specific value in the event of over-voltages. During rated operation, on the other hand, it has such a low resistance that the steady-state losses remain low. However, the AC power controller can also be designed as a circuit-breaker which, in the event of over-voltages, given an appropriate gate-source voltage initially limits the current to a predetermined amount and, given correspondingly continually lowered gate-source voltages, reduces the current. The AC power controller can also be used generally to set a specific current I in an operating range, independently of the voltage U.

What is claimed is:

1. An AC power controller comprising:

at least two semiconductor regions oppositely connected in series, each of the semiconductor regions having an electron donor, an electron sink, an electron-flow control electrode, and an internal body diode, each of the semiconductor regions having characteristic curves such as those exhibited by FETs;

a first one of the semiconductor regions being operated in a forward direction and having a gate-source voltage selected such that it defines an AC power controller current limit at a predetermined value; and a second one of the semiconductor regions being operated in an inverse direction, wherein the predetermined value of the AC power controller current limit is selected such that the internal body diode of the second one of the semiconductor regions is de-energized at the predetermined value of current.

2. An AC power controller according to claim 1, wherein the at least two semiconductor regions are formed from silicon carbide (SiC).

3. An AC power controller according to claim 2, wherein the semiconductor regions are formed in a micro-chip.

4. An AC power controller according to claim 2, wherein the semiconductor regions comprise discrete FETs.

* * * * *